(12) United States Patent
Kim et al.

(10) Patent No.: US 11,018,475 B2
(45) Date of Patent: May 25, 2021

(54) HIGH-OUTPUT POWER QUARTER-WAVELENGTH SHIFTED DISTRIBUTED FEEDBACK LASER DIODE

(71) Applicant: Electronics and Telecommunications Research Institute, Daejeon (KR)

(72) Inventors: Namje Kim, Daejeon (KR); O-Kyun Kwon, Daejeon (KR); Miran Park, Daejeon (KR); Tae-Soo Kim, Daejeon (KR); Shinmo An, Daejeon (KR); Won Seok Han, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/561,420

(22) Filed: Sep. 5, 2019

(65) Prior Publication Data

US 2020/0212652 A1 Jul. 2, 2020

(30) Foreign Application Priority Data

Dec. 27, 2018 (KR) .......................... 10-2018-0171305
Jul. 3, 2019 (KR) .......................... 10-2019-0080136

(51) Int. Cl.
*H01S 5/12* (2021.01)
*H01S 5/028* (2006.01)
(Continued)

(52) U.S. Cl.
CPC ............. *H01S 5/124* (2013.01); *H01S 5/026* (2013.01); *H01S 5/028* (2013.01); *H01S 5/02453* (2013.01); *H01S 5/0425* (2013.01)

(58) Field of Classification Search
CPC ............. H01S 5/124; H01S 5/028; H01S 5/12
(Continued)

(56) References Cited

U.S. PATENT DOCUMENTS 5,379,318 A * 1/1995 Weber ................. H01S 5/06256
372/20
6,807,201 B1 * 10/2004 Nitta ....................... H01S 5/227
372/29.02
(Continued)

FOREIGN PATENT DOCUMENTS

JP H0722215 B2 3/1995
JP 2013207023 A 10/2013
(Continued)

OTHER PUBLICATIONS

Gongyuan Zhao, et al., "Design and simulation of two-section DFB lasers with short active-section lengths", Optics Express 10590, vol. 24, No. 10, May 16, 2016.
(Continued)

*Primary Examiner* — Tuan N Nguyen
(74) *Attorney, Agent, or Firm* — Rabin & Berdo, P.C.

(57) ABSTRACT

Provided is a quarter-wavelength shifted distributed feedback laser diode. The laser diode includes a substrate having a laser diode section and a phase adjustment section, a waveguide layer on the substrate, a clad layer on the waveguide layer, a grating disposed in the clad layer in the laser diode section, an anti-reflection coating disposed on one side walls, of the substrate, the waveguide layer, and the clad layer, adjacent to the laser diode section, and a high reflection coating disposed on the other side walls, of the substrate, the waveguide layer, and the clad layer, adjacent to the phase adjustment section.

10 Claims, 10 Drawing Sheets

(51) Int. Cl.
*H01S 5/042* (2006.01)
*H01S 5/026* (2006.01)
*H01S 5/024* (2006.01)

(58) Field of Classification Search
USPC .............................. 372/26, 29.015; 385/37
See application file for complete search history.

(56) References Cited

U.S. PATENT DOCUMENTS

| | | | |
|---|---|---|---|
| 7,035,305 B2 | 4/2006 | Adams et al. | |
| 7,355,785 B2 | 4/2008 | Kim et al. | |
| 9,711,939 B2 | 7/2017 | Lee et al. | |
| 10,148,067 B2 | 12/2018 | Kwon et al. | |
| 2007/0104242 A1* | 5/2007 | Kudo | H01S 5/227 |
| | | | 372/96 |
| 2007/0195849 A1* | 8/2007 | Takagi | H01S 5/1228 |
| | | | 372/50.11 |
| 2010/0290489 A1* | 11/2010 | Agresti | H01S 5/12 |
| | | | 372/26 |
| 2012/0163405 A1 | 6/2012 | Su et al. | |

FOREIGN PATENT DOCUMENTS

| | | |
|---|---|---|
| KR | 10-0584412 B1 | 5/2006 |
| KR | 10-0809412 B1 | 3/2008 |
| KR | 10-2017-0055902 A | 5/2017 |

OTHER PUBLICATIONS

Xiaobo Xie, et al., "A Model for Optimization of the Performance of Frequency-Modulated DFB Semiconductor Laser", IEEE Journal of Quantum Electronics, pp. 1-10, May 2005.

* cited by examiner

HIGH-OUTPUT POWER QUARTER-WAVELENGTH SHIFTED DISTRIBUTED FEEDBACK LASER DIODE

CROSS-REFERENCE TO RELATED APPLICATIONS

This U.S. non-provisional patent application claims priority under 35 U.S.C. § 119 of Korean Patent Application Nos. 10-2018-0171305, filed on Dec. 27, 2018, and 10-2019-0080136, filed on Jul. 3, 2019, the entire contents of which are hereby incorporated by reference.

BACKGROUND

The present disclosure herein relates to a laser, and more particularly, to a quarter-wavelength shifted distributed feedback laser diode.

Research on semiconductor lasers is being conducted in the applications such as optical communications and sensors. In particular, semiconductor lasers for communications require stable tuning characteristics and high-output characteristics in addition to low-power, high-speed operation, and single-mode oscillation characteristics. Semiconductor lasers, having stable tuning characteristics, may include a distributed Bragg reflector (DBR) laser diode and a distributed feedback (DFB) laser diode. The DFB laser diode may include a λ/4-shifted DFB laser diode with the merit of a high single-mode yield.

SUMMARY

The present disclosure provides a distributed feedback (DFB) laser diode capable of continuously tuning a wavelength without mode hopping and obtaining an improved side mode suppression ratio (SMSR).

An embodiment of the inventive concept provides a distributed feedback (DFB) laser diode including: a substrate having a laser diode section and a phase adjustment section; a waveguide layer on the substrate; a clad layer on the waveguide layer; a grating disposed in the clad layer of the laser diode section; an anti-reflection coating disposed on one side walls of the substrate, the waveguide layer, and the clad layer, adjacent to the laser diode section; and a high reflection coating disposed on the other side walls of the substrate, the waveguide layer, and the clad layer, adjacent to the phase adjustment section. The laser diode section of the substrate includes: first and second laser diode sections; and a phase shift section between the first and second laser diode sections. The grating includes: a first grating disposed in the clad layer of the first laser diode section; and a second grating disposed in the clad layer of the second laser diode section and having a period different from that of the first grating.

In an embodiment, the period of the second grating may be three times greater than that of the first grating.

In an embodiment, the period of the first grating may be 240 nm, and the period of the second grating may be 720 nm.

In an embodiment, the DFB laser diode may further include first and second electrodes disposed on the clad layer of the laser diode section and the phase adjustment section.

In an embodiment, the DFB laser diode may further include: a first insulating layer on the first electrode; and a first heater on the first insulating layer.

In an embodiment, the DFB laser diode may further include: a second insulating layer disposed on the clad layer of the phase adjustment section; and a second heater on the second insulating layer.

In an embodiment, the substrate may further include an amplification section between the anti-reflection coating and the laser diode section.

In an embodiment, the DFB laser diode may further include a third electrode disposed on the clad layer of the amplification section.

In an embodiment, the substrate may further include a modulation section between the anti-reflection coating and the other side of the laser diode section.

In an embodiment, the DFB laser diode may further include a fourth electrode disposed on the clad layer of the modulation section.

In an embodiment, the DFB laser diode may further include a quantum well layer disposed in the waveguide layer of the laser diode section.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
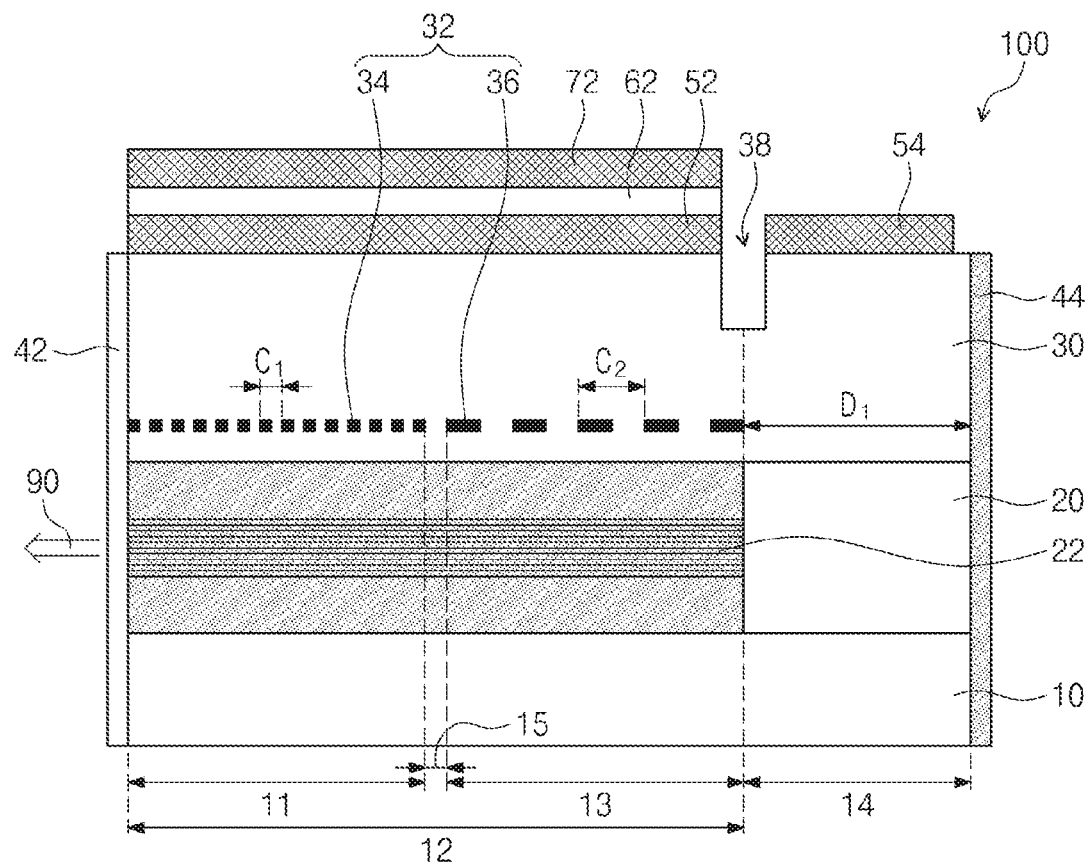
FIG. 1 is a cross-sectional view illustrating an example of a distributed feedback (DFB) laser diode according to an embodiment of the inventive concept.

Hereinafter, exemplary embodiments of the present invention will be described in detail with reference to the attached drawings. The merits and characteristics of the present invention and the methods of achieving the same will become more apparent from the following embodiments taken in conjunction with the accompanying drawings. However, the present invention is not limited to the embodiments described herein, but may be embodied in other forms. Rather, these embodiments are provided so that this disclosure will be thorough and complete, and will fully convey the scope of the present invention to those skilled in the art. The invention is only defined by the scope of the claims. Like reference numerals refer to like elements throughout the specification.

The terminology used herein is for the purpose of describing particular embodiments only and is not intended to be limiting of the present invention. As used herein, the singular forms, "a", "an" and "the" are intended to include the plural forms as well, unless the context clearly indicates otherwise. The terms "comprises" and/or "comprising," when used in this specification, specify the presence of stated components, steps, operations, and/or elements, but do not preclude the presence or addition of one or more other components, steps, operations, and/or elements. In addition, since the reference numerals have been used to clarify an exemplary embodiment, their sequences in description may not necessarily be limited to a numerical order.

Further, the embodiments herein will be described with reference to cross-sectional views and/or plan views, which are ideal illustrations of the present invention. In the drawings, the thickness of layers and sections is exaggerated for effective description of the technical contents. Thus, the shape of the illustrations may be modified by manufacturing techniques and/or tolerances. Accordingly, the embodiments of the present invention are not limited to the specific forms shown, but also include changes in the forms that are produced according to the manufacturing process.

FIG. 1 illustrates an example of a distributed feedback (DFB) laser diode 100 according to an embodiment of the inventive concept.

Referring to FIG. 1, the DFB laser diode 100 according to an embodiment of the inventive concept may be a λ/4-shifted DFB laser diode. For example, the DFB laser diode 100 according to an embodiment of the inventive concept may include a substrate 10, a waveguide layer 20, a clad layer 30, a grating 32, an anti-reflection coating 42, a high reflection coating 44, a first electrode 52, a second electrode 54, a first insulating layer 62, and a first heater 72.

The substrate 10 may be a lower clad layer. For example, the substrate 10 may include n-InP. The substrate 10 may be grounded. As an example, the substrate 10 may have a laser diode section 12 and a phase adjustment section 14. The laser diode section 12 may be a region in which a gain of the waveguide layer 20 is present, and the phase adjustment section 14 may be a region in which the gain of the waveguide layer 20 is not present. As an example, the laser diode section 12 may include a first laser diode section 11, a second laser diode section 13, and a phase shift section 15. The first and second laser diode sections 11 and 13 may be distanced from each other. The phase shift section 15 may be disposed between the first and second laser diode sections 11 and 13.

The waveguide layer 20 may be disposed on the substrate 10. The waveguide layer 20 may include InGaAsP, InGaAlAs, or InGaNAs. The waveguide layer 20 may have a quantum well layer 22. The quantum well layer 22 may be selectively disposed in the laser diode section 12. The quantum well layer 22 may be a gain medium for obtaining a gain of laser light 90. For example, the waveguide layer 20 may include an active waveguide layer and a passive waveguide layer. The active waveguide layer may be disposed in the laser diode section 12 and may have the quantum well layer 22. The passive waveguide layer may be disposed in the phase adjustment section 14. The passive waveguide layer, disposed in the phase adjustment section 14, may have a band gap having a wavelength shorter than that of the laser light 90. When the wavelength of the laser light 90 is about 1,530 nm, the waveguide layer 20 disposed in the phase adjustment section 14 may include a material which has a band gap corresponding to an oscillation wavelength of about 1.3 μm to about 1.35 μm.

The clad layer 30 may be disposed on the waveguide layer 20. The clad layer 30 may include p-InP. The clad layer 30 may have a groove 38. The groove 38 may be disposed in the boundary between the laser diode section 12 and the phase adjustment section 14. For example, the groove 38 may be disposed in the boundary between the laser diode section 12 and the phase adjustment section 14.

The grating 32 may be disposed in the clad layer 30 disposed in the first and second laser diode sections 11 and 13. In contrast, the grating 32 may be disposed in the substrate 10 disposed in the first and second laser diode sections 11 and 13. For example, the grating 32 may include copper (Cu) or InGaAs, and the embodiment of the inventive concept is not limited thereto.

As an example, the grating 32 may include a first grating 34 and a second grating 36. The first grating 34 and the second grating 36 may be disposed in the first laser diode section 11 and the second laser diode section 13, respectively. The first grating 34 and the second grating 36 may be separated from each other in the phase shift section 15. For example, the first grating 34 and the second grating 36 may be distanced from each other by a distance corresponding to a quarter of the wavelength λ of the laser light 90 in the phase shift section 15. For example, the phase shift section 15 may shift the phase of the laser light 90 by λ/4.

The first grating 34 may be disposed in the clad layer 30 disposed in the first laser diode section 11. For example, the first grating 34 may have a first period $C_1$ of about 240 nm. The first grating 34, having the first period $C_1$ of about 240 nm, may oscillate and/or generate the laser light 90 having a wavelength of about 1,530 nm.

The second grating 36 may be disposed in the clad layer 30 disposed in the second laser diode section 13. The second grating 36 may have a second period $C_2$ greater than the first period $C_1$ of the first grating 34. The second period $C_2$ may be an odd multiple of the first period $C_1$. When the second period $C_2$ is an even multiple of the first period $C_1$, the output efficiency of the laser light 90 may be reduced. When the first grating 34 is a first-order grating, the second grating 36 may be a third-order grating. For example, the second period $C_2$ of the second grating 36 may be three times greater than the first period $C_1$ of the first grating 34. When the first grating 34 has the first period $C_1$ of about 240 nm, the second grating 36 may have the second period $C_2$ of about 720 nm. The second grating 36, having the second period $C_2$ of about 720 nm, may oscillate the laser light 90 having a wavelength of about 1,530 nm.

The anti-reflection coating 42 may be disposed on one side walls of the substrate 10, the waveguide layer 20, and the clad layer 30. The anti-reflection coating 42 may be disposed to be adjacent to the laser diode section 12 of the substrate 10. The anti-reflection coating 42 may transmit the laser light 90 to the outside of the waveguide layer 20 without reflection. For example, the anti-reflection coating 42 may include a silicon oxide.

The high reflection coating 44 may be disposed on the other side walls of the substrate 10, the waveguide layer 20, and the clad layer 30. The high reflection coating 44 may be disposed to be adjacent to the phase adjustment section 14 of the substrate 10. The anti-reflection coating 42 may reflect the laser light 90. For example, the high reflection coating 44 may include aluminum (Al).

The first electrode 52 may be disposed on the clad layer 30 disposed in the laser diode section 12. For example, the first electrode 52 may include gold (Au), silver (Ag), copper (Cu), aluminum (Al), or tungsten (W). When source power is provided to the first electrode 52, the first electrode 52 may generate the laser light 90 by using the source power. The energy of the laser light 90 may increase in proportion to the source power.

Figure 2:
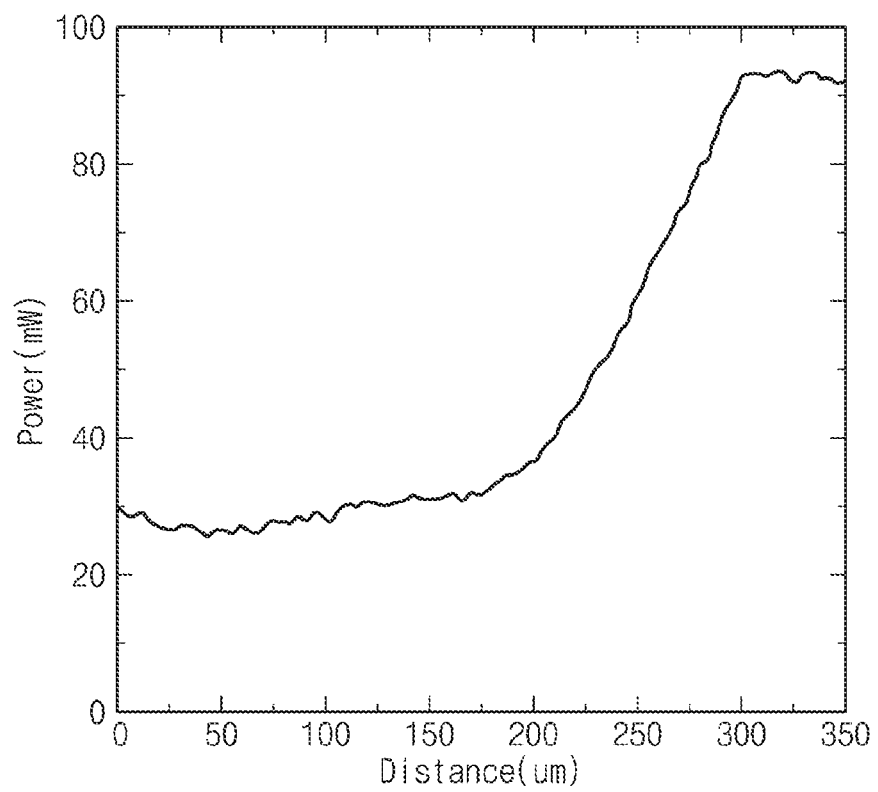
FIG. 2 is a graph illustrating the distribution of mode intensity of laser light when source power is provided to a first electrode of FIG. 1.

FIG. 2 illustrates the distribution of mode intensity of the laser light 90 when the source power is provided to the first electrode 52 of FIG. 1.

Referring to FIG. 2, the high reflection coating 44 may increase the mode intensity of the laser light 90 in the phase adjustment section 14. The laser diode section 12 may have a length of about 300 µm, and the phase adjustment section 14 may have a length of about 50 µm. The mode intensity of the laser light 90 in the phase adjustment section 14 may be higher than that of the laser light 90 in the laser diode section 12. For example, the mode intensity of the laser light 90 in the laser diode section 12 may be at least about 30 mW, and the mode intensity of the laser light 90 in the phase adjustment section 14 may be at most about 90 mW. The current of the source power is about 100 mA, the reflectance of the anti-reflection coating 42 is 0.00, the reflectance of the high reflection coating 44 is about 0.8, and the coupling constant of the grating 32 is about 0.005/µm.

Figure 3:
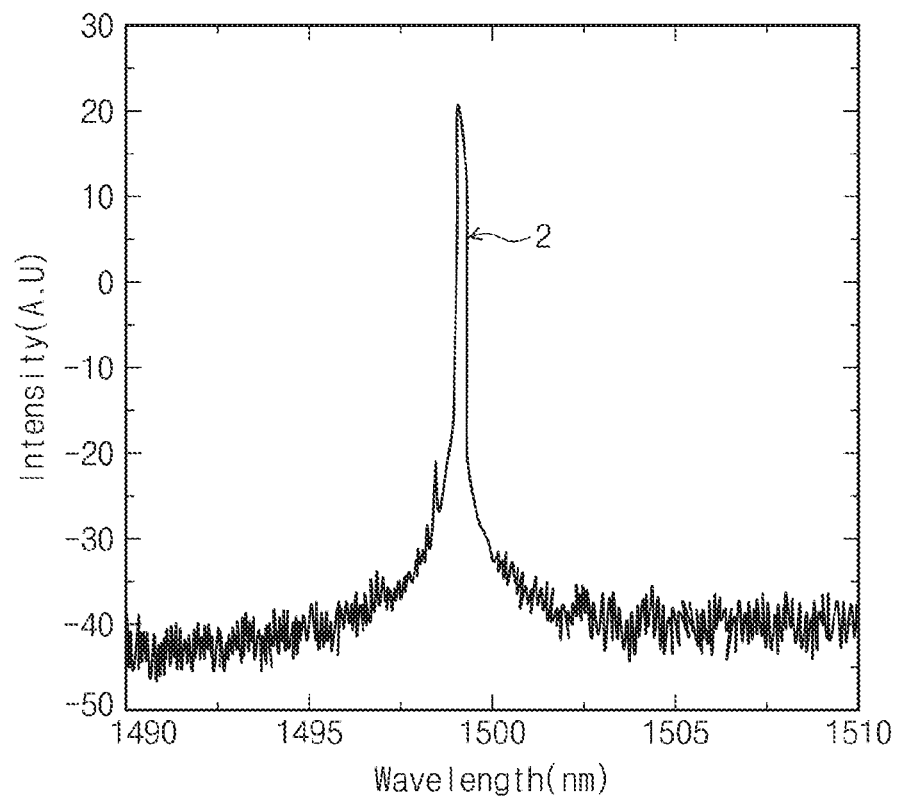
FIG. 3 is a graph illustrating the oscillation spectrum of the laser light of FIG. 1.

FIG. 3 illustrates the oscillation spectrum of the laser light 90 of FIG. 1.

Referring to FIG. 3, the anti-reflection coating 42 may generate an oscillation spectrum 2 in a Fabry-Perot (FP) mode to thus reduce the side mode suppression ratio (SMSR). The oscillation spectrum 2 of FIG. 3 due to the grating 32 may have a peak wavelength of about 1,499 nm. The SMSR of an oscillation mode may be obtained as about 45 dB higher than typical 40 dB. Thus, the DFB laser diode 100 according to an embodiment of the inventive concept may simultaneously increase the SMSR and the output power by using the phase adjustment section 14 and the high reflection coating 44.

Referring again to FIG. 1, the second electrode 54 may be disposed on the clad layer 30 disposed in the phase adjustment section 14. The second electrode 54 may include metal. When a control signal is applied to the second electrode 54, the second electrode 54 may provide a current to the phase adjustment section 14 to change effective refractive indexes of the waveguide layer 20 and the substrate 10, thereby adjusting the optical distance between the grating 32 and the high reflection coating 44. Further, the second electrode 54 may adjust the carrier density of the phase adjustment section 14.

The first insulating layer 62 may be disposed on the first electrode 52. For example, the first electrode 52 may include a dielectric layer made of a silicon oxide or a silicon nitride.

The first heater 72 may be disposed on the first insulating layer 62. The first insulating layer 62 may insulate the first heater 72 from the clad layer 30. The first heater 72 may include a metal layer made of nickel (Ni), chromium (Cr), or an alloy thereof. When heating power is provided to the first heater 72, the first heater 72 may heat the waveguide layer 20 and the clad layer 30 disposed in the laser diode section 12. When the waveguide layer 20 and the clad layer 30 disposed in the laser diode section 12 are heated, effective refractive indexes of the waveguide layer 20 and the clad layer 30 may increase. When the effective refractive indexes of the waveguide layer 20 and the clad layer 30 increase, the wavelength of the laser light 90 may increase. The wavelength of the laser light 90 may be increased by about 3 nm to about 5 nm. For example, the wavelength of the laser light 90 may be tuned by about 3 nm to about 5 nm. Thus, the DFB laser diode 100, according to an embodiment of the inventive concept may be employed and/or applied to a communication system, such as a next generation-passive optical network 2 (NG-PON2) system, requiring high output power and SMSR.

Figure 4:
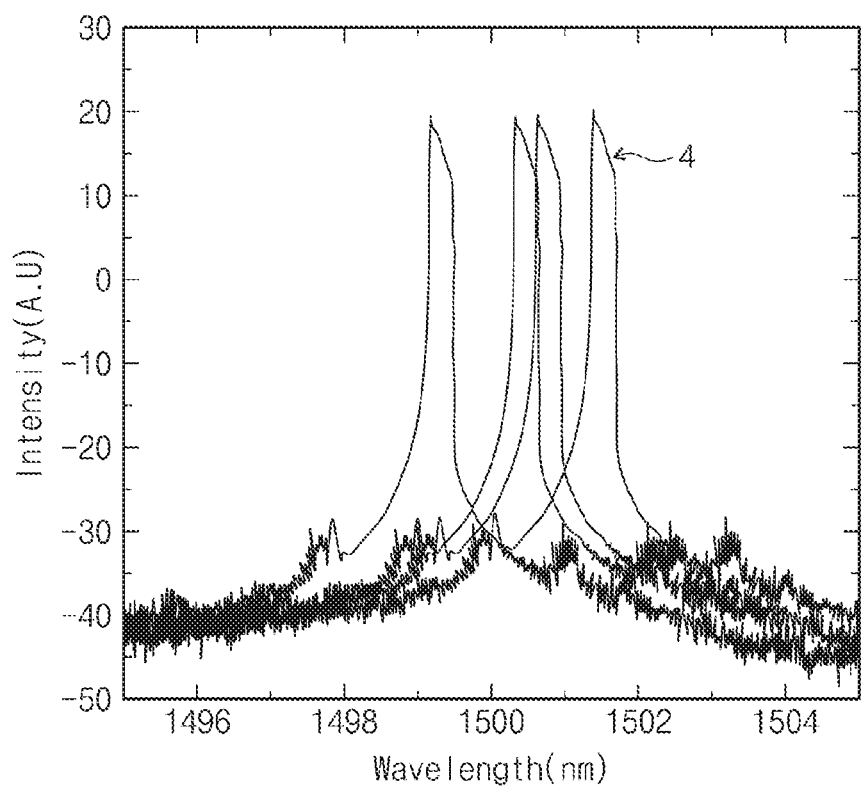
FIG. 4 is a graph illustrating a discontinuously tuned spectrum of a normal DFB laser diode.

FIG. 4 illustrates a discontinuously tuned spectrum 4 of a normal DFB laser diode.

Referring to FIG. 4, the normal DFB laser diode not having the phase adjustment section 14 may generate the laser light 90 having the discontinuously tuned spectrum 4 including mode hopping. The mode hopping may be caused by the competition between the FP mode and a DFB mode. The normal DFB laser diode may allow the wavelength of the laser light 90 to be tuned to a wavelength band in which the mode hopping occurs. However, the characteristics of the laser light 90 may be reduced by increases in the linewidth and noise of the oscillation mode. Further, the normal DFB laser diode may generate the laser light 90 having a SMSR of less than or equal to about 35 dB according to a mode breaking effect.

Figure 5:
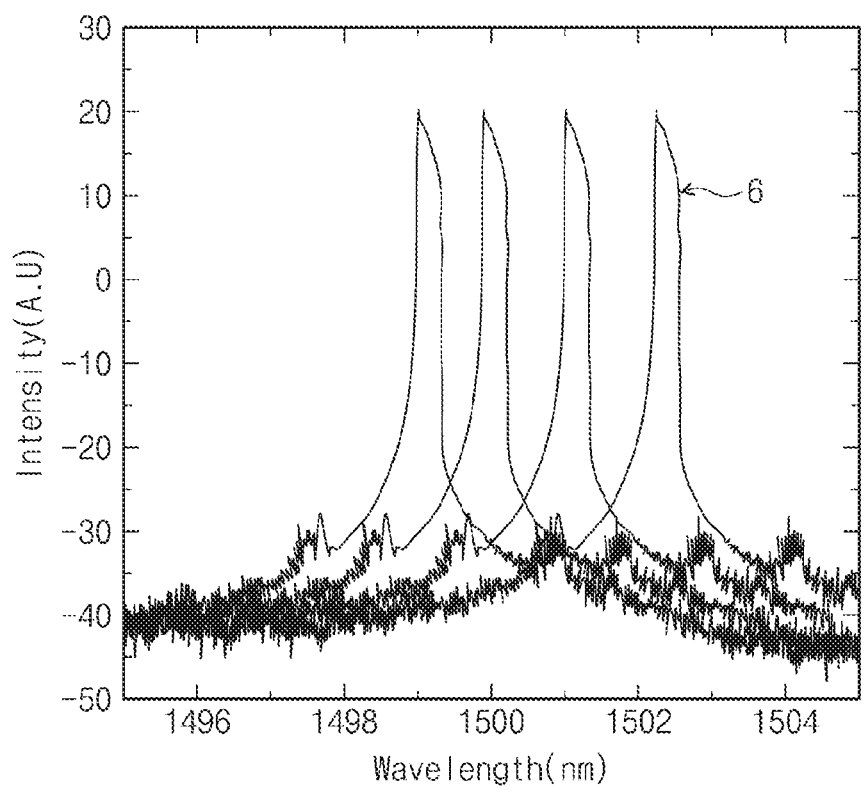
FIG. 5 is a graph illustrating a continuously tuned spectrum of the DFB laser diode according to an embodiment of the inventive concept.

FIG. 5 illustrates a continuously tuned spectrum 6 of the DFB laser diode 100 according to an embodiment of the inventive concept.

Referring to FIG. 5, the DFB laser diode 100 according to an embodiment of the inventive concept may oscillate the laser light 90 having the continuously tuned spectrum 6 without mode hopping. The DFB laser diode 100 may generate the laser light 90 having a SMSR of greater than or equal to about 45 dB by using the phase adjustment section 14 between the laser diode section 12 and the high reflection coating 44. Further, the phase adjustment section 14 may increase production yield by eliminating a reduction in single-mode characteristics due to the contact between the laser diode section 12 and the high reflection coating 44 in the related art.

Figure 6:
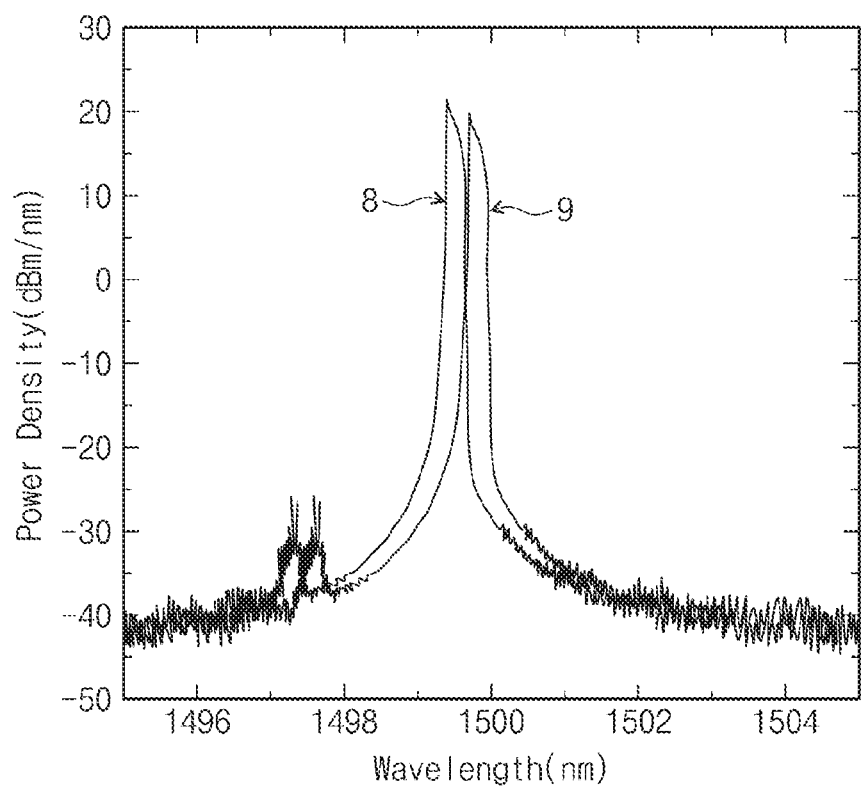
FIG. 6 is a graph illustrating the results of calculation of coupling constant-dependent characteristics for a laser diode section of FIG. 1.

FIG. 6 illustrates the results of calculation of coupling constant-dependent characteristics for the laser diode section 12 of FIG. 1.

Referring to FIG. 6, the DFB laser diode 100 according to an embodiment of the inventive concept may generate the laser light 90 having a first peak wavelength 8 with a coupling constant of 0.005/µm and a second peak wavelength 9 with a coupling constant of 0.008/µm. The length of the laser diode section 12 may be about 300 µm, and the length of the phase adjustment section 14 may be about 50 µm. According to H. Soda's coupled mode equation, the product kL of a coupling constant k and the distance L of the laser diode section 12 may be calculated to be about 1.5 and about 2.4. When the product kL of the coupling constant k and the distance L of the laser diode section 12 ranges from about 1 to about 3, the stable single-mode laser light 90 may be generated. Thus, the DFB laser diode 100 according to an embodiment of the inventive concept may generate the stable single-mode laser light 90.

Figure 7:
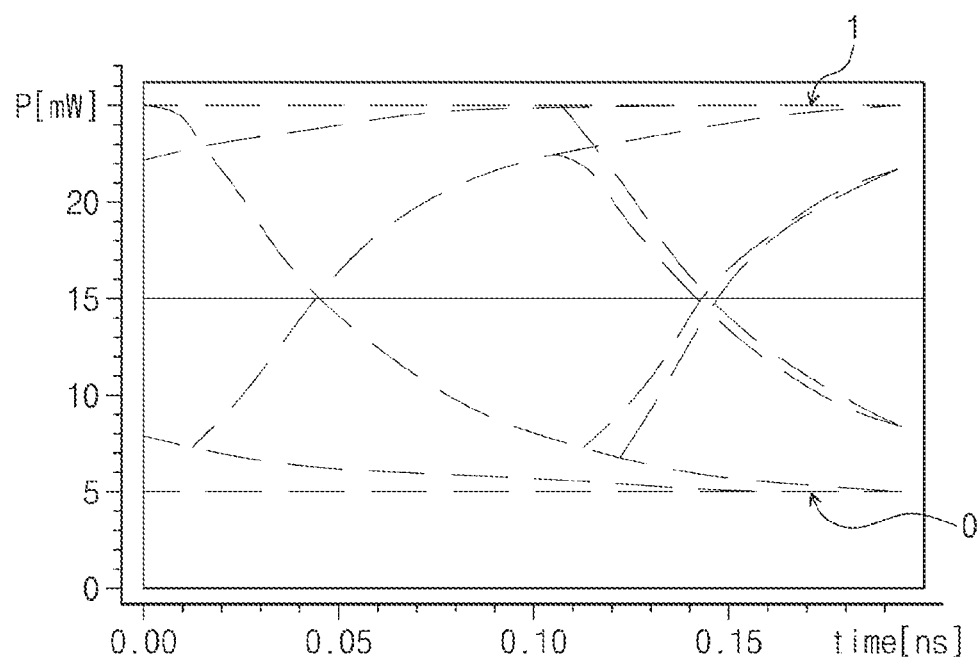
FIG. 7 is an eye diagram illustrating the direct modulation characteristics of the laser light of FIG. 1.

FIG. 7 illustrates the direct modulation characteristics of the laser light 90 of FIG. 1.

Referring to FIG. 7, the DFB laser diode 100 according to an embodiment of the inventive concept may output the laser light 90 having an average output power of about 15 mW using a direct modulation method. The top level output power 1 of the laser light 90 may be about 25 mW, and the bottom level output power 0 of the laser light 90 may be about 5 mW. Thus, the DFB laser diode 100 according to an embodiment of the inventive concept may generate the laser light 90 having high output power and capable of high-speed direct modulation.

Figure 8:
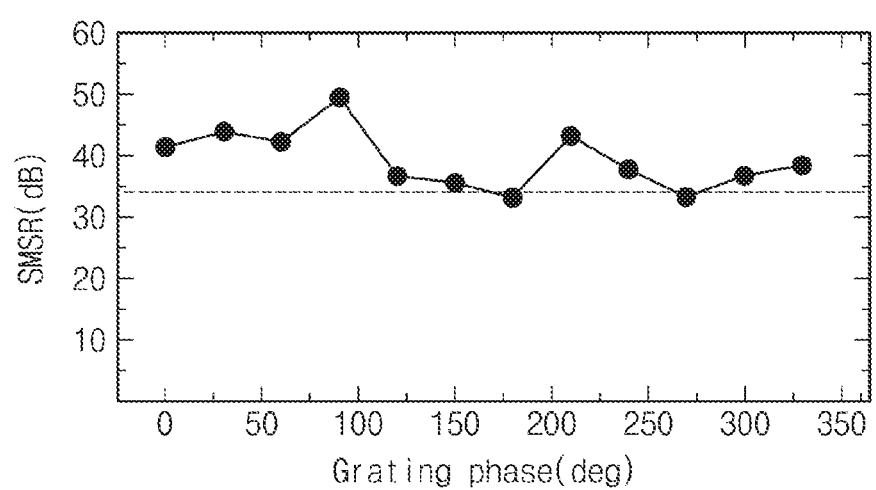
FIG. 8 is a graph illustrating side mode suppression ratios (SMSRs) in accordance with the phases of a second grating of FIG. 1.

FIG. 8 illustrates a SMSR according to the phase of the grating 32 corresponding to the distance between the second grating 36 and the high reflection coating 44 of FIG. 1.

Referring to FIG. 8, the DFB laser diode 100 according to an embodiment of the inventive concept may generate the laser light 90 having a SMSR of 35 dB to 50 dB greater than or equal to a normal SMSR. A horizontal axis indicates the phase of the second grating 36, and the vertical axis indicates the SMSR. The phase of the second grating 36 may correspond to the phase difference of the laser light 90 with respect to the distance D1 between the second grating 36 and the high reflection coating 44. For example, the phase of the second grating 36 may be indicated by 0° to 360° or by 0 to 2π rad.

Figure 9:
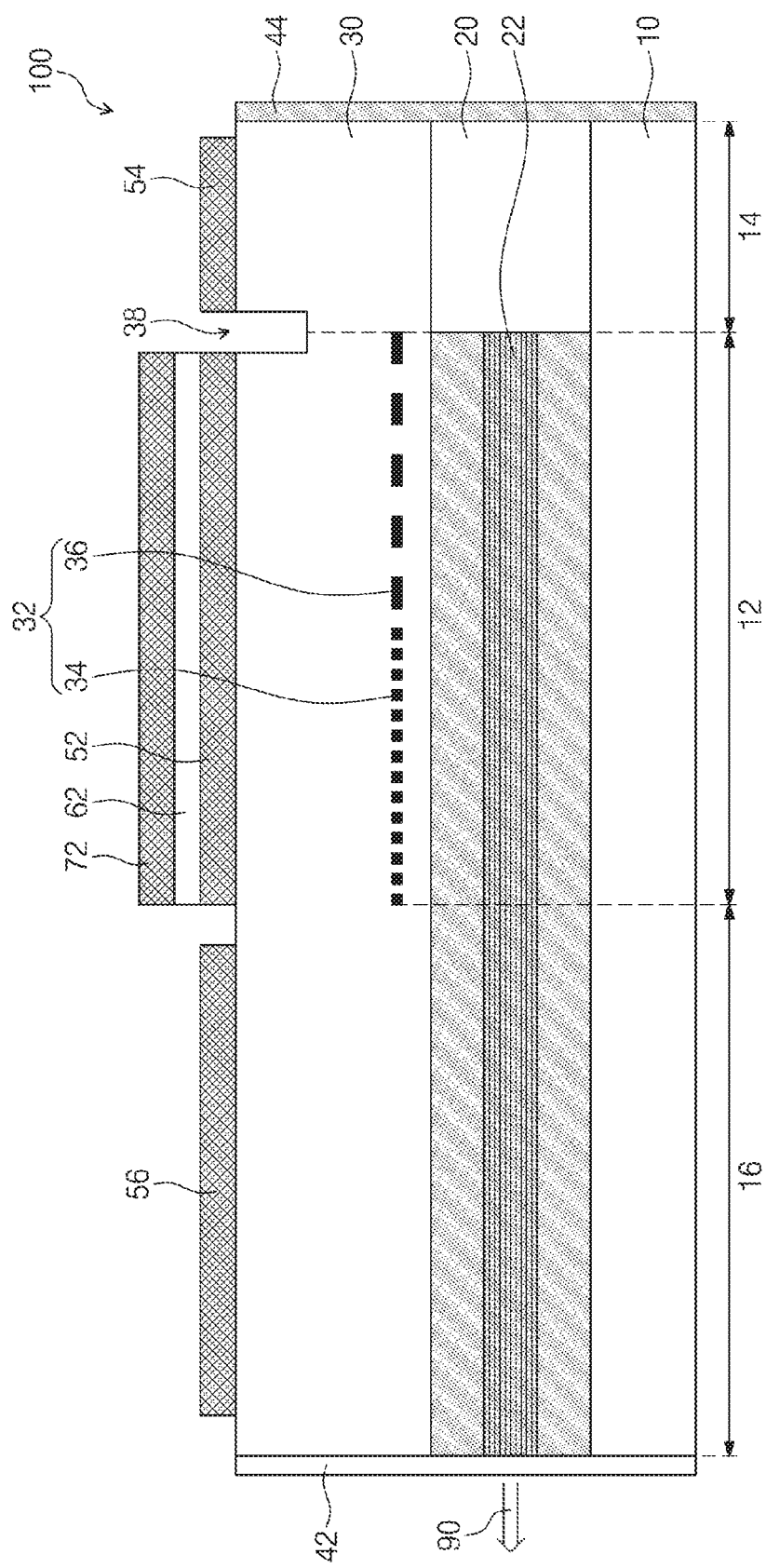
FIG. 9 is a cross-sectional view illustrating another example of the DFB laser diode according to an embodiment of the inventive concept.

FIG. 9 illustrates another example of the DFB laser diode 100 according to an embodiment of the inventive concept.

Referring to FIG. 9, the DFB laser diode 100 according to an embodiment of the inventive concept may include a semiconductor optical amplifier. For example, the DFB laser diode 100 according to an embodiment of the inventive concept may further have an amplification section 16. The amplification section 16 may be disposed between the anti-reflection coating 42 and the laser diode section 12.

The quantum well layer 22 may be disposed in the waveguide layer 20 disposed in the amplification section 16. The quantum well layer 22 may be used as a gain material in the waveguide layer 20 disposed in the amplification section 16.

A third electrode 56 may be disposed on the clad layer 30 disposed in the amplification section 16. When an amplification signal is applied to the third electrode 56, the laser light 90 may be amplified in response to the amplification signal. The laser light 90 may be amplified to have an output power of at most 60 mW.

The grating 32, the high reflection coating 44, the first electrode 52, the second electrode 54, the first insulating layer 62, and the first heater 72 may be configured in the same manner as in FIG. 1.

Figure 10:
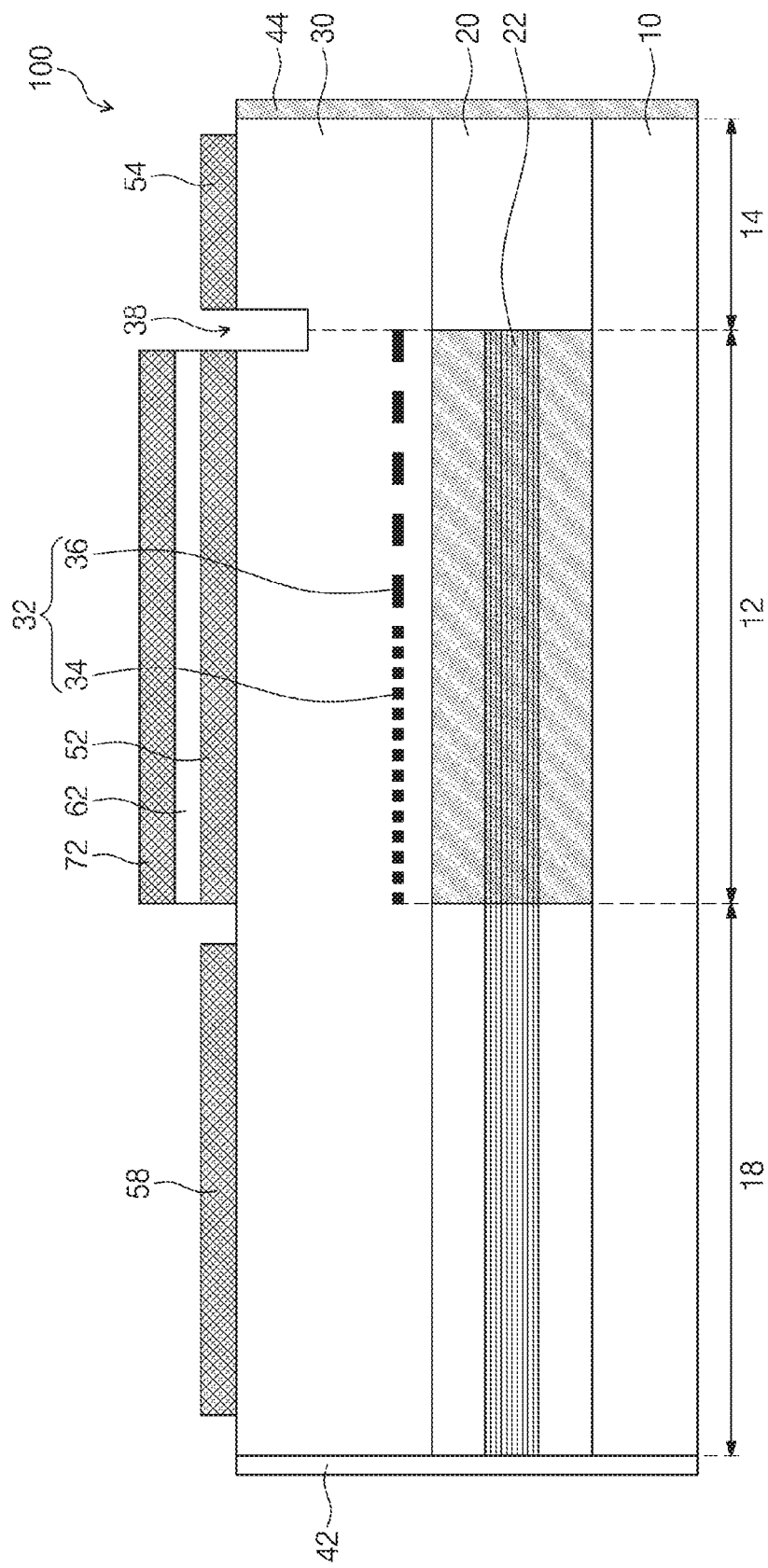
FIG. 10 is a cross-sectional view illustrating another example of the DFB laser diode according to an embodiment of the inventive concept.

FIG. 10 illustrates another example of the DFB laser diode 100 according to an embodiment of the inventive concept.

Referring to FIG. 10, the DFB laser diode 100 according to an embodiment of the inventive concept may include an electro-absorption modulator. For example, the DFB laser diode 100 according to an embodiment of the inventive concept may further have a modulation section 18. The modulation section 18 may be disposed between the anti-reflection coating 42 and the laser diode section 12.

The quantum well layer 22 may be disposed in the waveguide layer 20 disposed in the modulation section 18. The quantum well layer 22 may be used as a gain material in the waveguide layer 20 disposed in the modulation section 18.

A fourth electrode 58 may be disposed on the clad layer 30 disposed in the modulation section 18. When a modulation signal is applied to the fourth electrode 58, the fourth electrode 58 may modulate the laser light 90 by using the absorption loss due to the modulation signal.

The grating 32, the high reflection coating 44, the first electrode 52, the second electrode 54, the first insulating layer 62, and the first heater 72 may be configured in the same manner as in FIG. 1.

Figure 11:
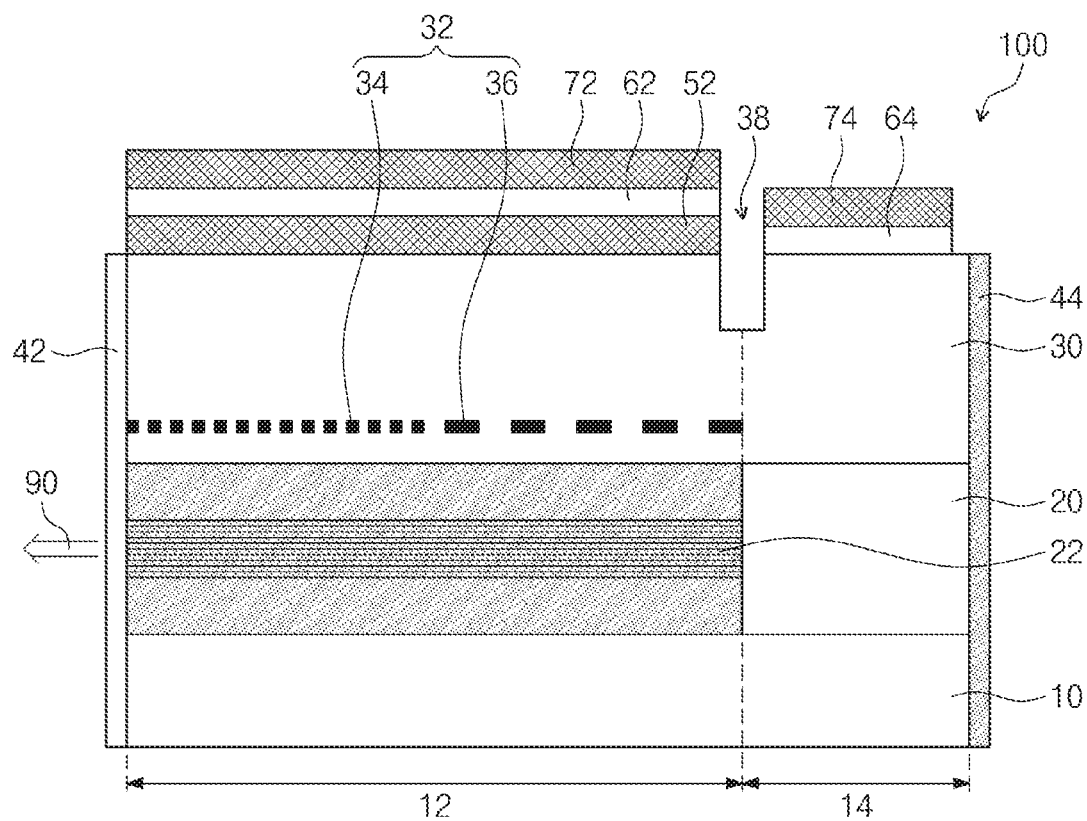
FIG. 11 is a cross-sectional view illustrating another example of the DFB laser diode according to an embodiment of the inventive concept.

FIG. 11 illustrates another example of the DFB laser diode 100 according to an embodiment of the inventive concept.

Referring to FIG. 11, the DFB laser diode 100 according to an embodiment of the inventive concept may include a second insulating layer 64 and a second heater 74 disposed in the phase adjustment section 14. The substrate 10, the waveguide layer 20, the clad layer 30, the grating 32, the high reflection coating 44, the anti-reflection coating 42, the first electrode 52, the first insulating layer 62, and the first heater 72 may be configured in the same manner as in FIG. 1.

The second insulating layer 64 may be disposed on the clad layer 30 disposed in the phase adjustment section 14. The second insulating layer 64 may include a dielectric layer made of a silicon oxide or a silicon nitride.

The second heater 74 may be disposed on the second insulating layer 64. The second insulating layer 64 may insulate the second heater 74 from the clad layer 30. When heating power is provided to the second heater 74, the second heater 74 may finely tune the wavelength of the laser light 90 by heating the waveguide layer 20 and the clad layer 30 disposed in the phase adjustment section 14.

As described above, a distributed feedback (DFB) laser diode according to an embodiment of the inventive concept may continue to tune the wavelength of laser light without mode hopping and obtain an improved side mode suppression ratio (SMSR) by using a phase adjustment section and a high reflection coating provided on a side wall in the phase adjustment section.

Although the embodiments of the present invention have been described with reference to the accompanying drawings, it will be understood by those skilled in the art that the present invention can be implemented in other specific forms without changing the technical idea or essential features thereof. Therefore, it should be understood that the embodiments described above are exemplary but not limitative in all aspects.

What is claimed is:

1. A distributed feedback (DFB) laser diode comprising:
   a substrate having a laser diode section and a phase adjustment section;
   a waveguide layer on the substrate;
   a clad layer on the waveguide layer;
   a grating disposed in the clad layer of the laser diode section;
   an anti-reflection coating disposed on one of side walls of the substrate, the waveguide layer, and the clad layer adjacent to the laser diode section; and
   a high reflection coating disposed on another of the side walls of the substrate, the waveguide layer, and the clad layer, adjacent to the phase adjustment section,
   wherein the laser diode section of the substrate comprises:
   first and second laser diode sections; and
   a phase shift section between the first and second laser diode sections,
   wherein the grating comprises:
   a first grating disposed in the clad layer of the first laser diode section; and
   a second grating disposed in the clad layer of the second laser diode section and having a period different from a period of the first grating,
   wherein the first grating has a first length in a first direction and a first period less than the first length in the first direction,
   wherein the second grating has a second length in the first direction and a second period less than the second length in the first direction, and
   wherein the second period of the second grating is three time greater than the first period of the first grating.

2. The DFB laser diode of claim 1, wherein the period of the first grating is 240 nm, and the period of the second grating is 720 nm.

3. The DFB laser diode of claim 1, further comprising first and second electrodes disposed on the clad layer of the laser diode section and the phase adjustment section.

4. A distributed feedback (DFB) laser diode comprising:
a substrate having a laser diode section and a phase adjustment section;
a waveguide layer on the substrate;
a clad layer on the waveguide layer;
a grating disposed in the clad layer of the laser diode section;
an anti-reflection coating disposed on one of side walls of the substrate, the waveguide layer, and the clad layer adjacent to the laser diode section;
a high reflection coating disposed on another of the side walls of the substrate, the waveguide layer, and the clad layer, adjacent to the phase adjustment section;
first and second electrodes disposed on the clad layer of the laser diode section and the phase adjustment section;
an insulating layer on the first electrode; and
a heater on the insulating layer,
wherein the laser diode section of the substrate comprises:
first and second laser diode sections; and
a phase shift section between the first and second laser diode sections, and
wherein the grating comprises:
a first grating disposed in the clad layer of the first laser diode section; and
a second grating disposed in the clad layer of the second laser diode section and having a period different from a period of the first grating.

5. A distributed feedback (DFB) laser diode comprising:
a substrate having a laser diode section and a phase adjustment section;
a waveguide layer on the substrate;
a clad layer on the waveguide layer;
an insulating layer disposed on the clad layer of the phase adjustment section;
a heater on the insulating layer;
a grating disposed in the clad layer of the laser diode section;
an anti-reflection coating disposed on one of side walls of the substrate, the waveguide layer, and the clad layer adjacent to the laser diode section; and
a high reflection coating disposed on another of the side walls of the substrate, the waveguide layer, and the clad layer, adjacent to the phase adjustment section,
wherein the laser diode section of the substrate comprises:
first and second laser diode sections; and
a phase shift section between the first and second laser diode sections,
wherein the grating comprises:
a first grating disposed in the clad layer of the first laser diode section; and
a second grating disposed in the clad layer of the second laser diode section and having a period different from a period of the first grating.

6. The DFB laser diode of claim 1, wherein the substrate further comprises an amplification section between the anti-reflection coating and the laser diode section.

7. The DFB laser diode of claim 6, further comprising a third electrode disposed on the clad layer of the amplification section.

8. The DFB laser diode of claim 1, wherein the substrate further comprises a modulation section between the anti-reflection coating and a side of the laser diode section.

9. The DFB laser diode of claim 8, further comprising a fourth electrode disposed on the clad layer of the modulation section.

10. The DFB laser diode of claim 1, further comprising a quantum well layer disposed in the waveguide layer of the laser diode section.

* * * * *